United States Patent
Koch (10) Patent No.: US 7,116,140 B2
(45) Date of Patent: Oct. 3, 2006

(54) CIRCUIT ARRANGEMENT FOR RECOGNIZING AND OUTPUTTING CONTROL SIGNALS, INTEGRATED CIRCUIT INCLUDING THE SAME, AND USE THEREOF

(75) Inventor: Anton Koch, Elztal-Auerbach (DE)

(73) Assignee: ATMEL Germany GmbH, Heilbronn (DE)

( * ) Notice: Subject to any disclaimer, the term of this patent is extended or adjusted under 35 U.S.C. 154(b) by 22 days.

(21) Appl. No.: 10/971,814

(22) Filed: Oct. 21, 2004

(65) Prior Publication Data
US 2005/0088206 A1 Apr. 28, 2005

(30) Foreign Application Priority Data
Oct. 22, 2003 (DE) ................................ 103 49 092

(51) Int. Cl.
*H03L 7/00* (2006.01)
(52) U.S. Cl. ........................................ 327/143; 327/198
(58) Field of Classification Search ................ 327/143, 327/198, 544
See application file for complete search history.

(56) References Cited

U.S. PATENT DOCUMENTS

| | | | | |
|---|---|---|---|---|
| 4,453,094 A | * | 6/1984 | Peil et al. ...................... | 326/36 |
| 5,926,049 A | * | 7/1999 | Shi ............................. | 327/170 |
| 6,249,174 B1 | | 6/2001 | Tsunezawa .................. | 327/538 |
| 6,411,070 B1 | | 6/2002 | Ito .............................. | 323/284 |
| 6,636,082 B1 | * | 10/2003 | Price, Jr. ..................... | 327/77 |
| 6,747,498 B1 | * | 6/2004 | Pauletti et al. .............. | 327/198 |
| 6,756,850 B1 | * | 6/2004 | Matsushita et al. ......... | 330/285 |

FOREIGN PATENT DOCUMENTS

DE 101 23 737 3/2002

* cited by examiner

*Primary Examiner*—Kenneth B. Wells
(74) *Attorney, Agent, or Firm*—W. F. Fasse; W. G. Fasse (57) ABSTRACT

An integrated circuit preferably to be connected to a motor vehicle battery is selectively switchable between sleep and normal operating modes. The IC may include a useful control logic circuit, a wake-up circuit evaluating an input signal and responsively outputting a wake-up signal dependent on the input signal, and an input control and supply circuit connected between the wake-up circuit and the control logic circuit. The wake-up circuit includes at least one recognition circuit having an amplifier arrangement to selectively amplify the input signal, and an evaluation circuit having a switch arrangement controlled by the amplified signal and an amplifier producing the output signal. The wake-up circuit has a very low current consumption while monitoring the input signal, and produces the wake-up signal only if the input signal suitably exceeds or falls below a specified voltage threshold. The wake-up signal may activate the control circuit, which may activate the logic circuit.

36 Claims, 2 Drawing Sheets

CIRCUIT ARRANGEMENT FOR RECOGNIZING AND OUTPUTTING CONTROL SIGNALS, INTEGRATED CIRCUIT INCLUDING THE SAME, AND USE THEREOF

PRIORITY CLAIM

This application is based on and claims the priority under 35 U.S.C. §119 of German Patent Application 103 49 092.2, filed on Oct. 22, 2003, the entire disclosure of which is incorporated herein by reference.

FIELD OF THE INVENTION

The invention relates to a circuit arrangement for recognizing a first electrical signal and outputting a second electrical signal dependent on and in response to the first signal. The invention further relates to an integrated circuit including such a circuit arrangement, as well as the use of such a circuit arrangement for recognizing an external wake-up signal to wake an integrated circuit from its sleep or standby mode into a normal operating mode, especially in the field of motor vehicle applications.

BACKGROUND INFORMATION

Circuit arrangements of the above mentioned general type are especially used in the field of automobile electronics. In that field of application, the integrated circuits (ICs) that are increasingly used in the vehicle electronics are supplied with power directly from the vehicle battery. In this regard, the problem typically arises, that the ICs may draw or consume no current or only a very limited current (e.g. I<10 µA) when the vehicle ignition is switched off, to avoid unnecessarily loading the battery, or especially to avoid excessively discharging or draining the battery. For this reason, the ICs are typically set into a so-called "sleep mode" or "standby mode" when their operation is not required and the ignition is switched off, and must then be "woken up" into the normal operating mode by an externally applied "wake-up" signal, for example by means of a remote control, for the respective ICs to become operational.

SUMMARY OF THE INVENTION

In view of the above, it is an object of the invention to provide a circuit arrangement for use preferably in the above described general field, whereby the circuit arrangement is characterized by a very low current consumption when it is directly connected to and powered by the battery of a motor vehicle. More particularly, through such a circuit arrangement, an integrated circuit (IC) that is in a sleep mode or standby mode can be "woken up" by an external signal. It is a further object of the invention to provide an integrated circuit arrangement that can be set into a standby mode in which it consumes only very little current, and can be switched into a normal operating mode in response to an external wake-up signal. The invention further aims to avoid or overcome the disadvantages of the prior art, and to achieve additional advantages, as apparent from the present specification. The attainment of these objects is, however, not a required limitation of the claimed invention.

The above objects have been achieved according to a first embodiment of the invention involving a first circuit arrangement of the above mentioned general type comprising a first signal recognition circuit and an evaluation circuit. The first signal recognition circuit is for receiving and recognizing the first signal that is defined relative to a reference potential, and includes an amplifier arrangement for amplifying the first signal, as well as a first switching device that is controllable by the first signal for controlledly providing the amplified signal. The evaluation circuit is for evaluating the provided amplified signal and includes a switch arrangement that is controllable by the amplified signal, as well as an amplifier device for outputting the second signal at an output of the circuit arrangement. Such a circuit arrangement does not draw or consume any current with the input open-circuited or having the reference potential prevailing thereon. The reference potential may, for example, be the ground of the circuit arrangement. When an external signal defined relative to the reference potential is applied, this circuit arrangement suitably amplifies this external signal and provides it in a controlled manner at the output, to be further used in the sense of the invention, for example for waking up an IC that is in a sleep or standby mode. This circuit arrangement is especially suitable and designed for recognizing external signals having a typical TTL (Transistor Transistor Logic) signal level, for example with an input level typically $\geq 0.8$ V.

Furthermore, the above objects have been achieved according to a second embodiment of the invention involving a second circuit arrangement of the above described general type, comprising a second signal recognition circuit and an evaluation circuit. The second recognition circuit includes an amplifier arrangement for amplifying a low level quiescent or resting current that flows through the second recognition circuit when a potential of the input signal at an input of the circuit arrangement drops or falls off relative to an essentially constant supply voltage. The evaluation circuit is for evaluating the amplified signal and includes a switch arrangement controllable by the amplified signal and an amplifier device for outputting the second signal at an output of the circuit arrangement. Due to the particular inventive configuration or embodiment of the second recognition circuit, this circuit arrangement is especially suitable for recognizing a waking trigger signal that is generated in the form of a voltage drop through the operation of a switch, such as an ignition lock contact, that is connected to the supply voltage.

The above objects have further been achieved according to the invention in a third embodiment involving a combined circuit arrangement that simultaneously includes both of the above mentioned first and second signal recognition circuits with the evaluation circuit. The above objects have still further been achieved according to the invention in an integrated circuit arrangement, especially for connection to a battery of a motor vehicle, having a useful circuit, e.g. the IC control logic, that is selectively switchable between a sleep mode and a normal operating mode, one of the above mentioned inventive first and second circuit arrangements, as well as a supply and control circuit for the useful circuit of the IC.

According to a further feature or embodiment of the first inventive circuit arrangement, the amplifier arrangement thereof is embodied as a current mirror circuit that is circuit-connected between the input and the reference potential. Thereby, the amplification effect can be achieved substantially independently of a load resistance. Correspondingly, a further variant of the first and second circuit arrangements provides that the respective switch arrangement is a second current mirror arrangement that is circuit-connected between an output of the signal recognition circuit and an essentially constant supply potential.

Further within the scope of the first inventive circuit arrangement, the switch device can be embodied as an amplifier device for amplifying at least one characteristic parameter of the amplified signal, such as its voltage, in order to thereby achieve an adaptation or matching to the supply voltage of the motor vehicle.

In connection with a preferred further embodiment of the first and second circuit arrangements according to the invention, these may additionally comprise a variable resistor arrangement circuit-connected in the evaluation circuit between the amplifier device and the reference potential. The variable resistor arrangement can preferably be embodied as a constant current circuit, whereby the variable resistor arrangement can be circuit-connected directly before or after (i.e. upstream or downstream of) the output. In this manner, an amplified current flow through the evaluation circuit causes the variable resistor functioning as a current source to go out of saturation, so that a potential at the output of the circuit arrangement switches or changes to a different state.

In order to limit the voltage at the output to a defined value, a most preferred further embodiment of the first and second circuit arrangements further comprises a constant voltage source arranged parallel at least to the output for the second signal and to the variable resistor arrangement.

A further embodiment of the first inventive circuit arrangement is characterized in that the amplifier arrangement thereof is designed or embodied for an activation thereof by the first signal at or exceeding a certain specified value of a characteristic parameter of the first signal. In that regard, preferably, this characteristic parameter is the voltage value of the first signal, which should lie approximately at the TTL signal level.

In a further preferred embodiment of the first and second circuit arrangements according to the invention, it is respectively provided that the circuit arrangement is designed or laid out and embodied for an activation by the amplified signal of the recognition circuit. In this manner it is ensured that no output signal will be generated or produced without a recognized input signal.

In a further embodiment of the first circuit arrangement, a defined potential such as a ground potential is to prevail at an open-circuited input thereof. To achieve this, a first resistor is connected between the input and the reference potential, parallel to the amplifier arrangement, in the recognition circuit.

In order to protect sensitive circuit components from over-voltage conditions, for example in the case of electrostatic discharges (ESD), a second resistor is preferably connected between the input and the first resistor and/or the amplifier arrangement and/or a control terminal of the switch device in the first circuit arrangement. As a still further feature, an over-voltage protection arrangement can be arranged at least between the control terminal of the switch device and the reference potential. In that regard, the over-voltage protection device can preferably be a diode, and especially a Zener diode.

Moreover, in further preferred embodiments of the first and second circuit arrangements, it is provided that a third resistor is circuit-connected parallel to the switch arrangement between the supply potential and the output potential of the recognition circuit to the evaluation circuit. According to the invention, this resistor serves as a leakage or dissipation resistor for the input-side circuit arrangement, so that this circuit arrangement remains blocked (non-conducting) in the standby mode in connection with low-level quiescent or resting current flows. Correspondingly, this resistor is dimensioned in such a manner so that only a small current (e.g. less than 2 µA or preferably only about 0.5 µA) will flow from the supply potential to the reference potential in connection with an inadequate or insufficient activation of at least the amplifier arrangement and/or the switch device of the recognition circuit.

In the second inventive circuit arrangement it can further be provided that the amplifier arrangement in the signal recognition circuit is formed of a first switch arrangement circuit-connected between the input and the evaluation circuit, and a second switch arrangement circuit-connected between the evaluation circuit and a reference potential. In that regard, at least respective first switch devices of the first and second switch arrangements are preferably connected together in the manner of a first current mirror circuit. With such an arrangement, it is possible to achieve not only a substantially load-independent current amplification, but also a level shifting toward the supply voltage.

In order to prevent a current flow into the supply voltage (e.g. battery voltage) in connection with a large input voltage at the input of the second inventive circuit arrangement, an electrical valve device, such as a diode, can be arranged between the signal recognition circuit and the evaluation circuit. Furthermore, an over-voltage protection arrangement, e.g. an ESD protection arrangement, is preferably operatively circuit-connected with the switch arrangements. These over-voltage protection arrangements can preferably comprise Zener diodes according to the invention.

To ensure that only a small quiescent or resting current (e.g. less than 2 µA or preferably only about 0.5 µA) will flow out of the battery when the second inventive circuit arrangement is in the standby mode, an especially preferred further embodiment of this second circuit arrangement is characterized by comprising a constant current circuit connected between the second circuit arrangement and the reference potential.

Preferably, the inventive circuit arrangements are embodied in a completely or fully integrated manner in a single integrated circuit, in order to ensure their simple space-saving and timely up-to-date application in practice. In that regard, especially at least the switch devices, switch arrangements, amplifier devices, and amplifier arrangements are respectively embodied as or formed of MOSFET transistors. When the inventive circuit arrangement is used for recognizing an external waking trigger signal and for outputting a responsive wake-up control signal for an integrated circuit that is in a standby mode, a most advantageous embodiment involves monolithically integrating both the integrated circuit as well as the inventive circuit arrangement together in common in the same single monolithic integrated circuit component.

As mentioned above, the inventive circuit arrangements are especially suitable for recognizing an external waking trigger signal for an integrated circuit that is in a standby mode, especially in motor vehicle applications. Note that the externally applied signal is generally called a waking trigger signal herein, but may also be called a wake-up signal, and the second signal produced by the inventive wake-up circuit is generally called a wake-up or wake-up control signal herein, so the pertinent signals referenced by these terms must be understood from the respective context.

BRIEF DESCRIPTION OF THE DRAWINGS

In order that the invention may be clearly understood, it will now be described in connection with an example embodiment thereof, with reference to the accompanying drawings, wherein.

DETAILED DESCRIPTION OF A PREFERRED EXAMPLE EMBODIMENT AND OF THE BEST MODE OF THE INVENTION

Figure 1:
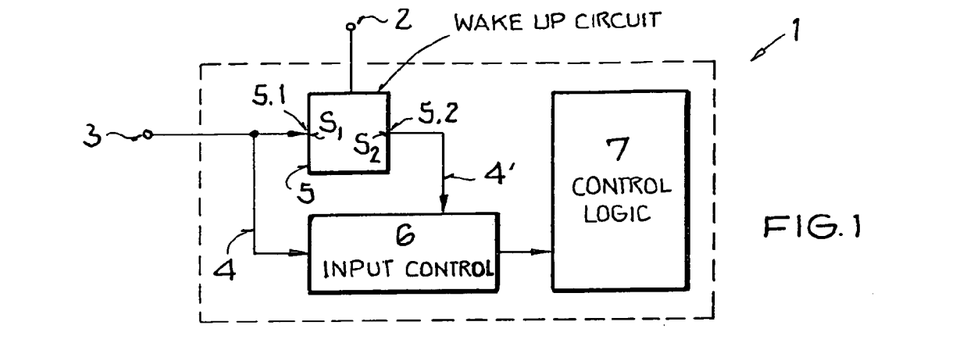
FIG. 1 is a block circuit diagram of an inventive integrated circuit including an inventive circuit arrangement for recognizing a waking trigger signal and responsively providing a wake-up control signal.

The block circuit diagram of FIG. 1 shows an integrated circuit (IC) 1, that is provided and embodied to be used as a control unit in a motor vehicle application. For this purpose, the integrated circuit 1 especially includes the actual useful circuit 7 such as a control logic circuit 7 that is to carry out the intended control functions for the specific motor vehicle application (according to any conventional or future developed teachings). In order to minimize the power consumption and especially the current drawn by the integrated circuit 1, the integrated circuit is designed to be selectively switchable between a normal operating mode (i.e. in which the control logic circuit 7 carries out its normal operating and control functions) and a sleep or standby mode (in which the normal operating and control functions of the control logic 7 are not needed for the application, e.g. when the vehicle ignition is switched off, and the current drawn by the circuit is to be minimized). In this regard, the integrated circuit 1 further includes a wake-up or waking circuit 5 as well as an input control circuit 6.

In the illustrated example embodiment, the integrated circuit 1 is completely or fully monolithically integrated, with all of the described components in one monolithic IC. The IC 1 has a power terminal 2 by which the IC 1 is connected to the supply voltage Vbatt having a voltage in a range from 7 V to 42 V, as supplied by the vehicle battery (not shown), by which the other electrical systems, e.g. the ignition (not shown), of the vehicle are also supplied with the necessary operating voltage. The IC 1 further includes a signal input 3 for an externally applied first signal S1 (and/or S1' as will be explained below), also called an input signal herein, which serves as the externally applied waking trigger signal that is to trigger the circuit to wake-up from the sleep mode or standby mode to the normal operating mode. The input 3 is connected via conductors 4 to the wake-up circuit 5 as well as the input control circuit 6, which is arranged and connected generally parallel to the wake-up circuit 5. The wake-up circuit 5 has an input 5.1 for receiving the first input signal S1 and an output 5.2 for outputting a second signal S2, which is connected via a further conductor 4' to the input control circuit 6. The useful circuit such as the control logic circuit 7 of the IC 1 is circuit-connected to the output of, or downstream from, the input control circuit 6.

As mentioned above, the externally applied first signal Si responsively causes the wake-up circuit 5 to release the second signal S2, which in turn is provided to the input control circuit 6, which thereupon responsively wakes up the IC 1 from the sleep or standby mode into the normal operating mode. The detailed internal construction and operation of the wake-up circuit 5 and of the input control circuit 6 will be described in the following, respectively with reference to FIG. 2 and FIG. 3.

Figure 2:
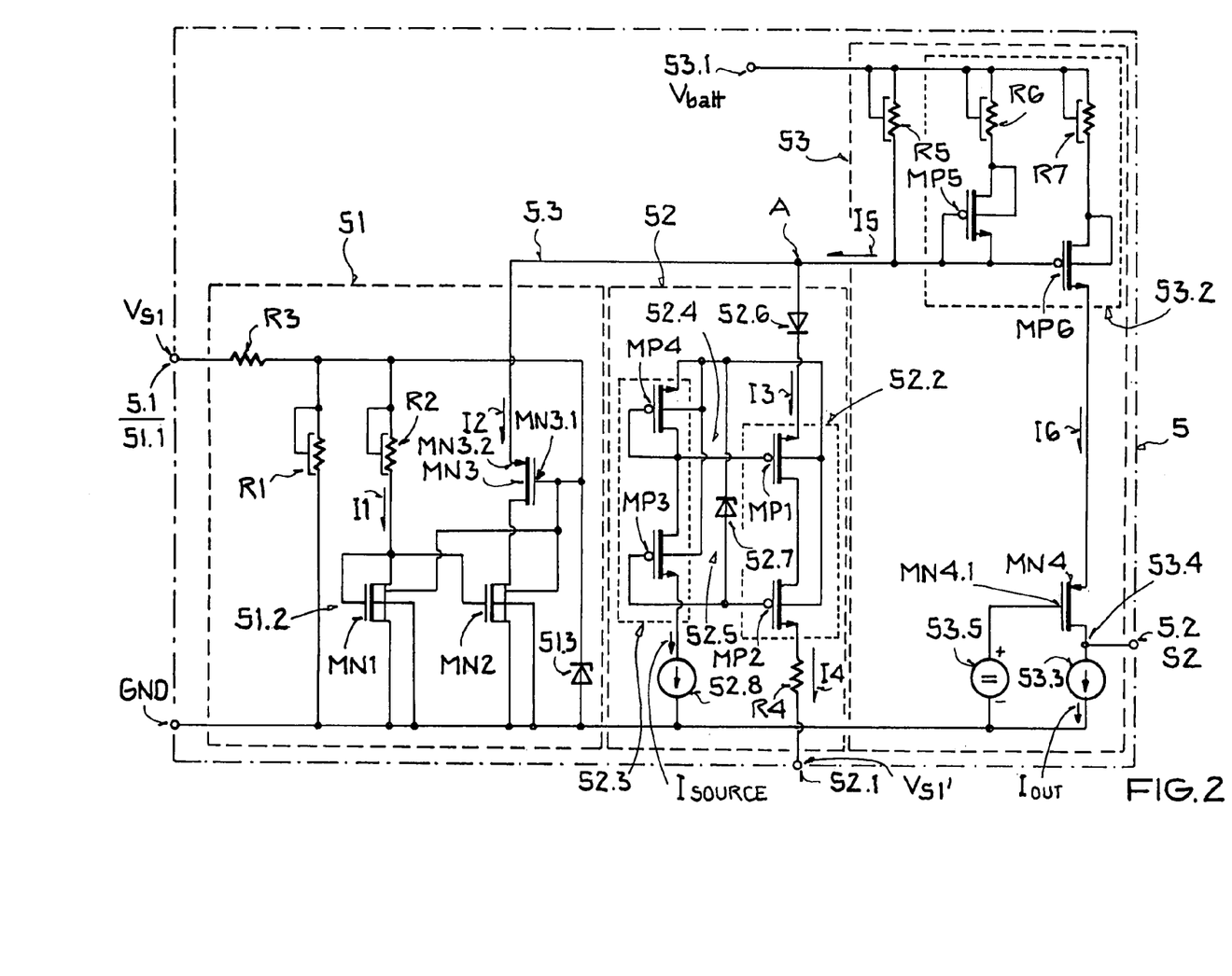
FIG. 2 is a more-detailed circuit diagram of an example of an inventive circuit arrangement.

As shown in FIG. 2, the wake-up circuit 5 includes three circuit parts or components 51, 52 and 53, which are generally identified in the following as the first and second signal recognition circuits 51 and 52 and the evaluation circuit 53.

The first signal recognition circuit 51 serves to recognize the externally applied first signal S1 having a typical TTL signal level at its input 51.1, which corresponds to the input 5.1 of the overall wake-up circuit 5. With regard to the TTL signal level, this means that the voltage $V_{S1}$ of the signal S1 lies at least 0.8 V above a reference potential such as the ground potential GND. As a central or primary component, the first recognition circuit 51 comprises an arrangement of two switch devices MN1 and MN2 that are circuit-connected together in the manner of a current mirror circuit 51.2 to form an amplifier arrangement. The two switch devices MN1 and MN2 are preferably embodied in the form of two n-channel MOSFET transistors MN1 and MN2. These switch devices MN1 and MN2 are generally connected, more particularly as shown in FIG. 2, between the input 51.1 and the reference potential GND. Note that the switch device MN2 is further connected in a circuit path between the evaluation circuit 53 and the reference potential GND, as will be explained below. A pull-down resistor R1 with a resistance value of 500 kΩ is connected between the input 51.1 and the reference potential GND parallel to the current mirror 51.2. The resistor R1 is preferably embodied as a p-well in the integrated circuit semiconductor structure. Furthermore, another resistor R2 embodied as a p-well and having a resistance value of 400 kΩ is connected in the input branch of the current mirror 51.2, namely between the input 51.1 and the switch device MN1. In an output branch of the current mirror 51.2, a high blocking further n-channel MOSFET transistor MN3 is arranged between the switch device MN2 and the evaluation circuit 53. The control terminal or gate MN3.1 of the transistor MN3 is connected to the input 51.1, i.e. 5.1. The first recognition circuit 51 still further comprises an additional resistor R3 with a resistance of 1 kΩ at the input 51.1 or 5.1. More particularly according to the invention, this resistor R3 is connected between the input 5.1 or 51.1 and the pull down resistor R1 and/or the current mirror 51.2 and/or the gate MN3.1 of the transistor MN3. Moreover, an over-voltage protection device or arrangement for protection against over-voltage conditions, as can arise in the case of an electrostatic discharge (ESD) for example, is connected at least between the gate MN3.1 of the transistor MN3 and the reference potential GND. This over-voltage protection device is preferably embodied as a Zener diode 51.3 with a Zener voltage of 7 V. The Zener diode 51.3 is oriented or connected in its blocking direction with respect to a positive voltage of the externally applied signal S1 relative to the reference potential GND.

As already mentioned, in addition to the above described first recognition circuit 51, the preferred embodiment of the inventive wake-up circuit 5 further comprises a second signal recognition circuit 52 arranged generally parallel to the first recognition circuit 51, and particularly connected via a conductor 5.3 with the drain terminal MN3.2 of the transistor MN3 of the first recognition circuit 51. The second recognition circuit 52 has an input 52.1 corresponding to an alternative of the input 5.1 of FIG. 1, for receiving an alternative externally applied first signal S1'. It should be noted that the externally applied signal S1', in the illustrated example embodiment, is produced and provided via a switch (not shown) within the motor vehicle, which in turn is directly energized and provided with the battery voltage.

The second signal recognition circuit 52 comprises a first switch arrangement 52.2 of two p-channel MOSFET transistors MP1 and MP2 connected between the input 52.1 and a junction node A on the conductor 5.3. In that regard, the transistor MP2 located closer to the input 52.1 is embodied as a self-blocking transistor in the illustrated example embodiment, while the other transistor MP1 is embodied as a self-conducting transistor. Between the junction node A and the reference potential GND, as well as essentially parallel to the first switch arrangement 52.2, the second recognition circuit 52 further comprises a second switch arrangement 52.3 that is similarly formed of a self-blocking p-channel MOSFET transistor MP3 and a self-conducting p-channel MOSFET transistor MP4. Thereby, the self-blocking transistor MP3 is arranged on the side of the reference potential GND. Moreover, the two self-blocking transistors MP2 and MP3 as well as the two self-conducting transistors MP1 and MP4 are respectively pair-wise connected in the manner of a first current mirror circuit 52.4 of transistors MP1 and MP4 and a second current mirror circuit 52.5 of transistors MP2 and MP3.

In direct proximity to the junction node A, the second signal recognition circuit 52 further comprises an electrical valve device, preferably in the form of a diode 52.6, which is oriented or arranged so that if a higher potential relative to the supply voltage Vbatt is applied to or prevails at the input 52.1, no current will flow from the input 52.1 into the supply voltage Vbatt connected to the power terminal 53.1. Still further, a protection arrangement for protecting the second recognition circuit 52 or its components from overvoltage conditions, in the form of a Zener diode 52.7 with a Zener voltage of 7 V, is electrically operatively connected with the switch arrangements 52.2 and 52.3 as shown in FIG. 2.

Still further as shown in FIG. 2, a current source 52.8 with $I_{source}$=0.5 μA is arranged between the second switch arrangement 52.3 and the reference potential GND. A resistor R4 with a resistance of 1 kΩ is connected between the transistor MP2 of the switch arrangement 52.2 and the input 52.1.

The inventive wake-up circuit 5 further comprises an evaluation circuit 53 provided in common for evaluating the output signals of both the first and second signal recognition circuits 51 and 52. The evaluation circuit 53 is connected after or downstream of the recognition circuits 51 and 52 via the junction node A. The evaluation circuit 53 is provided with the supply voltage Vbatt directly from the battery (not shown) via the power terminal 53.1. The evaluation circuit 53 comprises a resistor R5 embodied as a p-well and having a resistance of 400 kΩ connected between the junction node A and the power terminal 53.1, as well as a current mirror circuit 53.2 embodying a switch arrangement connected parallel to the resistor R5. The current mirror circuit 53.2 includes two self-blocking p-channel MOSFET transistors MP5 and MP6, as well as respective resistors R6 and R7 embodied as p-wells and having a resistance of 50 kΩ respectively, connected respectively between the power terminal 53.1 and the transistors MP5 and MP6. In the illustrated example embodiment, a variable resistance arrangement or variable resistor in the form of a current source 53.3 with $I_{out}$=2 μA is arranged between the current mirror circuit 53.2 and the reference potential GND. Additionally, the evaluation circuit 53 comprises an output 53.4 that simultaneously represents the overall output 5.2 of the overall wake-up circuit 5 for outputting the second signal S2. The output 53.4 is connected directly before or upstream of the current source 53.3 with respect to the current mirror 53.2.

As further seen in FIG. 2, a 5V constant DC voltage source 53.5 is connected parallel to at least the output 53.4 and the current source 53.3. This DC voltage source 53.5 is provided in the form of a constant voltage circuit having its negative or minus pole connected to the reference potential GND and having its positive or plus pole connected to the gate MN4.1 of a self-blocking n-channel MOSFET transistor MN4 that is connected with its conduction path between the output 53.4 and the current mirror 53.2.

The wake-up circuit 5 functions and operates in the following manner. If the input 51.1 is open-circuited or lies at the reference potential GND, then the first recognition circuit 51 does not consume or draw any current. If the voltage at the input 51.1 rises to a value of more than 0.8 V above the reference potential GND, for example due to a suitable externally applied signal S1 (e.g. by means of a remote control applying such a signal), then the wake-up circuit 5 will produce the second signal S2 at its output 5.2, i.e. 53.4, whereby this second signal S2 will serve to switch or wake-up the IC 1 (FIG. 1) from the standby mode into the normal operating mode, as will be described further below.

The input resistor R3 and the Zener diode 51.3 of the fist signal recognition circuit 51 serve as ESD protection elements for the 5-volt circuit components arranged after or behind these protective elements. The pull-down resistor R1 ensures that a defined reference potential GND will prevail on the input 51.1 when the input 51.1 is otherwise open-circuited, e.g. has no external signal applied thereto. As the input voltage applied to the input 51.1 increases, a current I1 flows through the resistor R2 into the current mirror 51.2, which is particularly designed or embodied to amplify the current I1 by a factor of four so as produce the amplified mirrored current I2, whereby the current value of I2=4×I1. In other words, the current mirror 51.2 functions as a 4× amplifier arrangement for the current I1. Through the transistor MN3, the amplified current I2 is then caused to flow through (e.g. is drawn from) the evaluation circuit 53 to be evaluated therein. In that regard, the inventive high-blocking transistor MN3 serves as a level shifter between the low voltage transistor MN2 and the voltage level Vbatt of the battery supply in the evaluation circuit 53.

Contrary to the above described first signal recognition circuit 51, the second signal recognition circuit 52 is embodied and provided for recognizing voltage signals characterized by a voltage drop or decrease of the voltage applied to the input 52.1, for example upon actuating a switch in the motor vehicle. In other words, while the first recognition circuit 51 recognized a signal S1 rising above a certain threshold voltage, the second recognition circuit 52 recognizes a signal S1' based on a falling or decreasing voltage. If the input 52.1 is open-circuited or lies at the supply potential, i.e. the battery voltage Vbatt, then the inventive circuit arrangement will only draw or consume a very small current, since only the constructively determined current I3=$I_{source}$=0.5 μA will be drawn by the current source 52.8 and flow through the transistors MP1 and MP2 and also through the diode 52.6. Such a small current flow does not yet lead to an activation of the evaluation circuit 53, as will be described further below, and thus does not lead to the output of the second signal S2 (i.e. the wake-up control signal). If the voltage prevailing on or applied to the input 52.1 falls to a value that lies about 2.1 V below the supply voltage Vbatt, then a current I4 begins to flow through the conduction path of the diode 52.6, the transistors MP1 and MP2, and the resistor R4. The necessary voltage difference for triggering the beginning of this current flow is the sum of the conduction voltage of the diode 52.6, the gate-source voltage of the transistor MP1 in the recognition circuit 52 and the gate-source voltage of the transistor MP6 in the evaluation circuit 53.

The current level of the current I4 is determined by the current mirror circuit 52.4, which amplifies the current $I_{source}$ of the current source 52.8 by a factor of 18 from 0.5 µA to 9 µA, so that the current value of the current I3=9.5 µA is given by the sum of $I_{source}$ and I4. This current level of current I3 serves to trigger the generation of the wake-up signal through the evaluation circuit 53 as will be described below.

The transistors MP2 and MP3 serve as level shifters with respect to the battery supply voltage Vbatt. The diode 52.6 prevents a potentially damaging current flow back into the battery supply voltage in a case in which the voltage prevailing at the input 52.1 is greater than the battery supply voltage Vbatt. The Zener diode 52.7 protects the sensitive gate and source layers of the p-channel MOSFET transistors MP1 to MP4 from over-voltages that would otherwise have a damaging effect.

Dependent on the level of its input current I5, the evaluation circuit 53 generates a logical wake-up signal as the second signal S2 with a typical TTL signal level, for further use within the integrated circuit (IC) 1 for waking up the IC 1 (FIG. 1). In the standby mode, merely a resting current I5 of 0.5 µA flows from the battery into the recognition circuit 52. With such a low current flow, the resistor R5 serves its function as a leakage or dissipation resistor so that the transistors MP5 and MP6 of the current mirror 53.2 of the evaluation circuit 53 will remain blocked, i.e. non-conducting. However, if the current I5 increases by more than 2 µA, then the current mirror 53.2 will be activated, and will thereby mirror and amplify the current I5 with an amplification factor of 1 to form the current I6. That is to say, in this regard, the current mirror 53.2 according to the invention functions as a switch arrangement that is controllable by the current level of the current I5. Finally, the current I6 flows through the transistor MN4, which simply serves as an amplifier device.

If the value of I6 is greater than 2 µA, that is to say greater than the value of the current $I_{out}$=2 µA produced by the current source 53.3, then the current source 53.3 will go out of saturation, and the voltage at the output 53.4, 5.2 will rise from a logic low value to a logic high value. The maximum voltage of the wake-up signal, i.e. the second signal S2 at the output 53.4, 5.2, is limited by the 5V constant voltage, which is, however, further reduced by the gate-source voltage of the amplifying transistor MN4. Thus, the output voltage of the wake-up signal S2 typically lies at about 4.3 V as the high level, which is sufficient for switching the IC from the standby mode into the normal operating mode. The manner in which this is achieved will now be further explained with a description of the structure and function of the input control circuit 6 with reference to FIG. 3.

Figure 3:
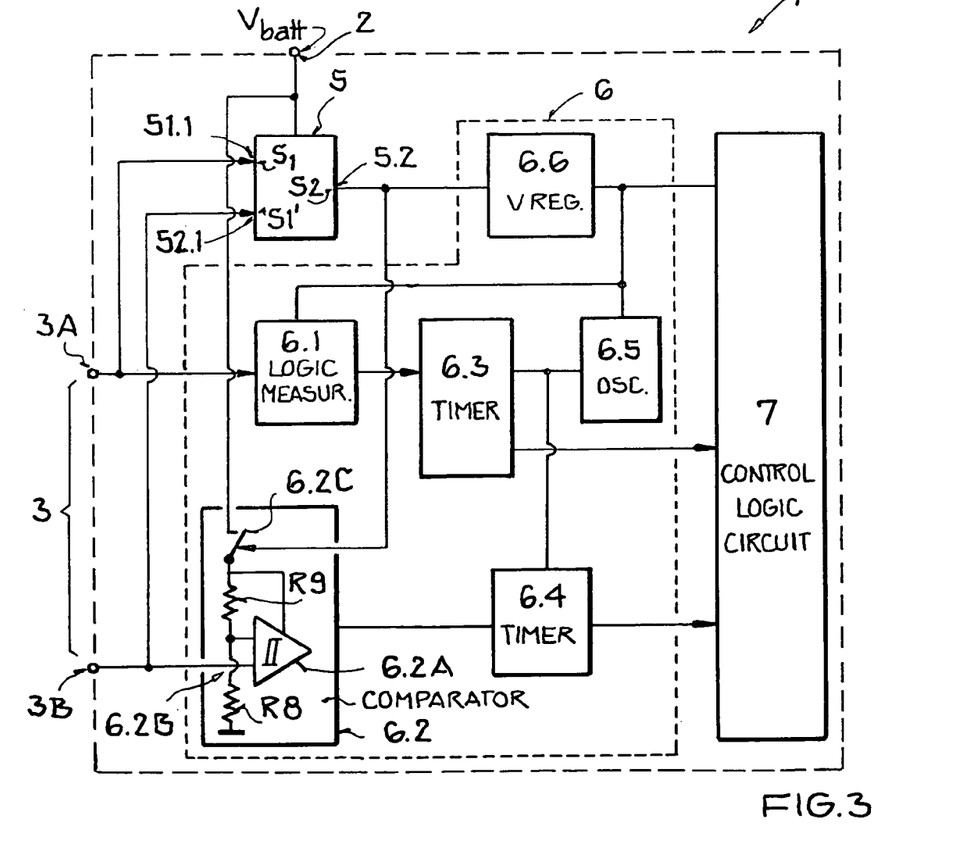
FIG. 3 is a second more-detailed block circuit diagram of the integrated circuit according to FIG. 1, showing additional details of an input control circuit thereof.

FIG. 3 shows a block circuit diagram essentially corresponding to that of FIG. 1, of the integrated circuit or IC 1 including the wake-up circuit 5, the input control circuit 6, and the useful circuit such as the control logic circuit 7. In FIG. 3, however, the input control circuit 6 is shown with further detail in comparison to FIG. 1. Also note that the wake-up circuit 5 has been shown with two inputs 51.1 and 52.1 by which the two recognition circuits 51 and 52 respectively receive the alternative signal forms (as applicable) of the first input signal S1 or S1' being externally applied respectively to the two separated inputs 3A or 3B making up the overall input 3 of the IC 1 shown in FIG. 1.

The input control circuit 6 includes a threshold value measuring arrangement or logic input arrangement 6.1 for receiving the input signal S1, and/or a comparator arrangement 6.2 for the alternative input signal S1' and the battery supply voltage Vbatt applied to the power terminal 2. The comparator arrangement 6.2 comprises an operational amplifier 6.2A arranged and functioning as a comparator, as well as a reference voltage divider 6.2B formed of two resistors R8 and R9 between the selectively applied battery supply voltage Vbatt and the reference potential GND. The reference voltage divider 6.2B is connected in series with, and thereby selectively activatable by, a switch device 6.2C that is switched by the second signal S2 that is output as the wake-up control signal S2 by the wake-up circuit 5. Respective time measuring arrangements 6.3 and 6.4 in the form of debounce timers are connected after or downstream of the threshold value measuring or logic input arrangement 6.1 and the comparator arrangement 6.2. An oscillator 6.5 as a clock or timing source is connected to the time measuring arrangements or timers 6.3 and 6.4. A 5V voltage regulator 6.6 is provided to supply a regulated voltage at least to the oscillator 6.5, the threshold value measuring or logic input arrangement 6.1 and the useful circuit such as the control logic circuit 7. The voltage regulator 6.6, in turn, is supplied with its operating voltage from the battery voltage Vbatt connected to the power terminal 2. Furthermore, the voltage regulator 6.6 is connected to the output 5.2 of the wake-up circuit 5 for receiving the wake-up control signal S2.

As described above in detail, when the IC 1 is in a sleep or standby mode, the circuit and particularly the wake-up circuit draws a very low current. Then, upon the application of a suitable first input signal S1 or S1', the internal 5V voltage regulator 6.6 is first activated or switched on. Accordingly, the voltage regulator 6.6 provides operating voltage to the internal useful circuit such as the control logic circuit 7 and additionally activates the oscillator 6.5. Simultaneously the threshold value measuring or logic input arrangement 6.1 is provided with a 5V operating voltage to activate the same, so that it then recognizes the input signal S1 at the input 3A if the signal S1 has reached the correct voltage threshold. Thereupon, the timer 6.3 measures a pulse duration of the input signal.

If the signal S1 is only a short signal peak or spike, or for example an interference pulse, of which the pulse duration lies below a predetermined value t(debounce), then the entire IC 1 will again return to the standby mode after the end of this pulse. Otherwise, if the pulse duration of the signal S1 is greater than the minimum required duration t(debounce), then the input signal will be correctly recognized as such, and the circuit will be switched from the standby mode into the normal operating mode. Namely, a suitable control signal will be provided from the timer 6.3 to the control logic circuit 7, which serves to switch the control logic circuit 7 into the fully functional normal operating mode.

Alternatively, if the alternative input signal S1' has been applied to the alternative input 3B, a similar switching process as described above is carried out by means of the comparator arrangement 6.2 and the timer 6.4. If the input signal S1' lies below the required threshold, and has a signal duration greater than the required minimum duration, then the timer 6.4 will release a suitable activating signal to the control logic circuit 7, to activate the control logic circuit 7 into the fully functional normal mode.

Note that if the respective input signal S1 or S1' does not meet the signal level criteria of the appropriate signal for waking up the IC, then the wake-up circuit 5 will not even activate the voltage regulator 6.6 or the voltage divider 6.2B via the switch 6.2C of the comparator arrangement 6.2, so that no current will be drawn by the input control circuit 6.

In the above described manner according to the invention, it is possible to evaluate an input signal, which has been provided for waking-up the IC, with reference to a proper voltage threshold, and thereby to screen or filter out undesired interference signals, while consuming only a very low current.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A circuit arrangement for recognizing an electrical input signal and outputting an output signal in response to and dependent on said input signal, said circuit arrangement comprising:
    a reference terminal at which a reference potential is to be applied;
    an input terminal at which said input signal is to be applied, wherein said input signal is defined relative to said reference potential;
    an output terminal at which said output signal is to be output;
    a recognition circuit that is connected between said input terminal and said reference terminal, and that includes an amplifier arrangement adapted to generate an amplified signal in accordance with said input signal, and a first switch device which is controllable by said input signal so as to provide said amplified signal in a controlled manner at an amplified signal output of said recognition circuit;
    an evaluation circuit that is connected between said amplified signal output and said output terminal, and that includes a switch arrangement connected to said amplified signal output and controllable by said amplified signal, and that is adapted to produce and output said output signal at said output terminal; and
    a power terminal at which a supply voltage is to be applied;
    wherein said switch arrangement of said evaluation circuit comprises a current mirror circuit connected between said power terminal and said output terminal and between said power terminal and said amplified signal output of said recognition circuit.

2. The circuit arrangement according to claim 1, wherein said amplifier arrangement of said recognition circuit comprises a further current mirror circuit connected between said input terminal and said reference terminal.

3. The circuit arrangement according to claim 1, wherein said evaluation circuit further includes an amplifier device connected between said switch arrangement and said output terminal.

4. The circuit arrangement according to claim 3, wherein said evaluation circuit further includes a variable resistance arrangement connected between said amplifier device and said reference terminal.

5. The circuit arrangement according to claim 4, wherein said variable resistance arrangement comprises a constant current circuit.

6. The circuit arrangement according to claim 4, wherein said variable resistance arrangement is connected directly to said output terminal, either before or after said output terminal relative to said amplifier device.

7. The circuit arrangement according to claim 4, wherein said evaluation circuit further includes a constant voltage circuit connected between said amplifier device and said reference terminal.

8. The circuit arrangement according to claim 1, wherein said amplifier arrangement of said recognition circuit is adapted to be activated by said input signal when a parameter of said input signal exceeds a certain value.

9. The circuit arrangement according to claim 1, wherein said switch arrangement of said evaluation circuit is adapted to be activated by said amplified signal.

10. The circuit arrangement according to claim 1, wherein said recognition circuit further includes a first resistor connected between said input, terminal and said reference terminal parallel to said amplifier arrangement.

11. The circuit arrangement according to claim 10, wherein said recognition circuit further includes a second resistor connected between said input terminal and a parallel arrangement of said first resistor and said amplifier arrangement.

12. The circuit arrangement according to claim 1, wherein said recognition circuit further includes a resistor connected between said input terminal and said amplifier arrangement and/or between said input terminal and a control terminal of said first switch device of said recognition circuit.

13. The circuit arrangement according to claim 1, wherein said first switch device of said recognition circuit comprises an amplifier adapted to amplify a second parameter of said input signal other than a first parameter of said input signal by which said first switch device is controllable.

14. The circuit arrangement according to claim 1, wherein said recognition circuit further includes an over-voltage protection arrangement connected between a control terminal of said first switch device and said reference terminal.

15. The circuit arrangement according to claim 1, wherein said evaluation circuit further includes a resistor connected between said power terminal and said amplified signal output parallel to said switch arrangement.

16. The circuit arrangement according to claim 15, wherein said resistor has such a resistance so that only a small current less than 2 µA will flow from said power terminal to said reference terminal through said evaluation circuit and said recognition circuit when said amplifier arrangement and/or said switch device are not activated by said input signal.

17. A circuit arrangement for recognizing an electrical input signal and outputting an output signal in response to and dependent on said input signal, said circuit arrangement comprising:
    a power terminal at which a supply voltage is to be applied;
    an input terminal at which said input signal is to be applied, wherein said input signal is defined relative to said supply voltage;
    an output terminal at which said output signal is to be output;
    a recognition circuit that is connected between said input terminal and said power terminal, and that includes an amplifier arrangement adapted to amplify a quiescent current flowing through said recognition circuit from said power terminal to produce an amplified signal at an amplified signal output of said recognition circuit when a potential of said input signal applied to said input terminal drops below a threshold value relative to said supply voltage;

an evaluation circuit that is connected between said amplified signal output and said output terminal, and that includes a switch arrangement connected to said amplified signal output and controllable by said amplified signal, and that is adapted to produce and output said output signal at said output terminal; and an electrical valve device connected between said recognition circuit and said evaluation circuit.

18. The circuit arrangement according to claim 17, wherein said evaluation circuit further includes an amplifier device connected between said switch arrangement and said output terminal.

19. The circuit arrangement according to claim 17, wherein said electrical valve device is adapted and arranged to prevent a current flow therethrough when said potential of said input signal is higher than said supply voltage.

20. The circuit arrangement according to claim 17, further comprising a reference terminal at which a reference potential is to be applied, wherein said amplifier arrangement comprises a first switch arrangement connected between said input terminal and said evaluation circuit, and a second switch arrangement connected between said reference terminal and said evaluation circuit, whereby at least respective first switch devices of said first and second switch arrangements are connected with one another to form thereof a current mirror circuit.

21. The circuit arrangement according to claim 20, wherein said recognition circuit further includes an overvoltage protection arrangement operatively connected with said switch arrangements.

22. The circuit arrangement according to claim 20, wherein said recognition circuit further includes a constant current circuit connected between said second switch arrangement and said reference terminal.

23. The circuit arrangement according to claim 18, wherein said switch arrangement of said evaluation circuit comprises a current mirror circuit connected between said power terminal and said amplifier device of said evaluation circuit and between said power terminal and said amplified signal output of said recognition circuit.

24. The circuit arrangement according to claim 18, further comprising a reference terminal at which a reference potential is to be applied, wherein said evaluation circuit further includes a variable resistance arrangement connected between said amplifier device and said reference terminal.

25. The circuit arrangement according to claim 24, wherein said variable resistance arrangement comprises a constant current circuit.

26. The circuit arrangement according to claim 24, wherein said variable resistance arrangement is connected directly to said output terminal, either before or after said output terminal relative to said amplifier device.

27. The circuit arrangement according to claim 24, wherein said evaluation circuit further includes a constant voltage circuit connected between said amplifier device and said reference terminal.

28. A circuit arrangement for recognizing an electrical input signal and outputting an output signal in response to and dependent on said input signal, said circuit arrangement comprising:

a power terminal at which a supply voltage is to be applied;

an input terminal at which said input signal is to be applied, wherein said input signal is defined relative to said supply voltage;

an output terminal at which said output signal is to be output;

a recognition circuit that is connected between said input terminal and said power terminal, and that includes an amplifier arrangement adapted to amplify a quiescent current flowing through said recognition circuit from said power terminal to produce an amplified signal at an amplified signal output of said recognition circuit when a potential of said input signal applied to said input terminal drops below a threshold value relative to said supply voltage; and an evaluation circuit that is connected between said amplified signal output and said output terminal, and that includes a switch arrangement connected to said amplified signal output and controllable by said amplified signal, and that is adapted to produce and output said output signal at said output terminal;

wherein said input signal is a second input signal, said input terminal is a second input terminal at which said second input signal is to be applied, said recognition circuit connected between said second input terminal and said power terminal is a second recognition circuit, said amplifier arrangement is a second amplifier arrangement, said amplified signal is a second amplified signal, said amplified signal output is a second amplified signal output, wherein said circuit arrangement further comprises a reference terminal at which a reference potential is to be applied, a first input terminal at which a first input signal defined relative to said reference potential is to be applied, and a first recognition circuit, wherein said first recognition circuit is connected between said first input terminal and said reference terminal, and includes a first amplifier arrangement adapted to generate a first amplified signal in accordance with said first input signal, and a first switch device which is controllable by said first input signal so as to provide said first amplified signal in a controlled manner at a first amplified signal output of said first recognition circuit, and wherein said evaluation circuit is connected to both said first and second amplified signal outputs, and said switch arrangement is controllable by both said first and second amplified signals.

29. A circuit including a circuit arrangement for recognizing at least one electrical input signal and outputting an output signal in response to and dependent on said at least one input signal, said circuit arrangement comprising:

a reference terminal at which a reference potential is to be applied;

a power terminal at which a supply voltage is to be applied;

at least one input terminal selected from the group consisting of a first input terminal at which a first input signal is to be applied, wherein said first input signal is defined relative to said reference potential, and a second input terminal at which a second input signal is to be applied, wherein said second input signal is defined relative to said supply voltage;

an output, terminal at which said output signal is to be output;

at least one recognition circuit selected from the group consisting of: a first recognition circuit that is connected between said first input terminal and said reference terminal, and that includes a first amplifier arrangement adapted to generate an amplified signal in accordance with said first input signal, and a first switch device which is controllable by said first input signal so as to provide said first amplified signal in a controlled manner at a first amplified signal output of said first recognition circuit; and a second recognition circuit that is connected between said second input terminal and said power terminal, and that includes a second amplifier arrangement adapted to amplify a quiescent current flowing through said second recognition circuit from said power terminal to produce a second amplified signal at a second amplified signal output of said second recognition circuit when a potential of said second input signal applied to said second input terminal drops below a threshold value relative to said supply voltage; and an evaluation circuit that is connected between at least one of said first and second amplified signal outputs and said output terminal, and that includes a switch arrangement connected to said at least one of said amplified signal outputs and controllable by at least one of said first and second amplified signals, and that is adapted to produce and output said output signal at said output terminal;

wherein said circuit further includes at least one other circuit component connected with said circuit arrangement and adapted to be selectively put in a standby mode or a normal operating mode, and wherein said first or second input signal is an externally applied waking trigger signal and said output signal is a wake-up control signal to wake-up said other circuit component from said standby mode to said normal operating mode.

30. The circuit according to claim 29, comprising both said first recognition circuit and said second recognition circuit.

31. The circuit according to claim 29, being a monolithic fully integrated circuit.

32. The circuit according to claim 29, wherein said first amplifier arrangement, said second amplifier arrangement, said first switch device, said switch arrangement and said amplifier device respectively each comprise at least one respective MOSFET transistor.

33. The circuit according to claim 29, being an integrated circuit including said circuit arrangement and said at least one other circuit component monolithically integrated in common together in said integrated circuit.

34. The circuit according to claim 29, wherein said at least one other circuit component comprises a useful control logic circuit that can be selectively switched between said standby mode and said normal operating mode, and an input control circuit interposed between said output terminal of said circuit arrangement and said useful control logic circuit, and wherein said power terminal is to be connected to a battery of a motor vehicle.

35. A method of using the circuit according to claim 29, comprising:
   a) applying said waking trigger signal to said circuit arrangement;
   b) generating and outputting said wake-up control signal from said circuit arrangement dependent on and in response to said waking trigger signal; and
   c) in response to said wake-up control signal, waking up said at least one other circuit component from said standby mode to said normal operating mode.

36. The circuit according to claim 29, wherein said evaluation circuit further includes an amplifier device connected between said switch arrangement and said output terminal.

* * * * *

UNITED STATES PATENT AND TRADEMARK OFFICE
CERTIFICATE OF CORRECTION

PATENT NO. : 7,116,140 B2  
APPLICATION NO. : 10/971814  
DATED : October 3, 2006  
INVENTOR(S) : Koch It is certified that error appears in the above-identified patent and that said Letters Patent is hereby corrected as shown below:

Column 5,  
Line 63, after "signal", replace "Si" by --S1--;

Column 12,  
Line 18, after "input", delete ",".

Column 14,  
Line 63, after "an output", delete ",".

Signed and Sealed this

Tenth Day of April, 2007

JON W. DUDAS  
*Director of the United States Patent and Trademark Office*